United States Patent
Chang et al.

(10) Patent No.: US 8,765,549 B2
(45) Date of Patent: Jul. 1, 2014

(54) CAPACITOR FOR INTERPOSERS AND METHODS OF MANUFACTURE THEREOF

(75) Inventors: Chun Hua Chang, Zhubei (TW);
Shin-Puu Jeng, Hsin-Chu (TW);
Der-Chyang Yeh, Hsin-Chu (TW);
Shang-Yun Hou, Jubei (TW);
Wen-Chih Chiou, Miaoli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 86 days.

(21) Appl. No.: 13/458,476

(22) Filed: Apr. 27, 2012

(65) Prior Publication Data

US 2013/0285200 A1    Oct. 31, 2013

(51) Int. Cl.
*H01L 21/8242* (2006.01)

(52) U.S. Cl.
USPC ........... 438/250; 438/680; 438/692; 438/700; 257/E21.006; 257/E21.17; 257/E21.19; 257/E21.229; 257/E21.252; 257/E21.256; 257/E21.267; 257/E21.278; 257/E21.293; 257/E21.616; 257/E21.304; 257/E21.647

(58) Field of Classification Search
USPC ......... 438/250, 238, 239, 381, 270, 700, 706, 438/745, 680, 692, 740, 743, 756; 257/E21.006, E21.17, E21.19, 257/E21.229, E21.252, E21.256, E21.267, 257/E21.278, E21.293, E21.304, E21.616, 257/E21.647

See application file for complete search history.

(56) References Cited

U.S. PATENT DOCUMENTS

| | | | |
|---|---|---|---|
| 6,320,213 B1 * | 11/2001 | Kirlin et al. | 257/295 |
| 7,435,627 B2 | 10/2008 | Horton et al. | |
| 7,518,881 B2 | 4/2009 | Cornelius | |
| 7,635,887 B2 * | 12/2009 | Steltenpohl | 257/306 |
| 7,835,157 B2 * | 11/2010 | Tilmans et al. | 361/765 |
| 7,846,852 B2 | 12/2010 | Shioga et al. | |
| 7,851,322 B2 | 12/2010 | Chiang | |
| 8,546,233 B2 * | 10/2013 | Steltenpohl | 438/386 |
| 2008/0296697 A1 | 12/2008 | Hsu et al. | |
| 2010/0044089 A1 | 2/2010 | Shibuya et al. | |
| 2010/0213600 A1 | 8/2010 | Lau et al. | |
| 2010/0233359 A1 | 9/2010 | Shioga et al. | |
| 2011/0068444 A1 | 3/2011 | Chi et al. | |

* cited by examiner

*Primary Examiner* — David Nhu
(74) *Attorney, Agent, or Firm* — Slater and Matsil, L.L.P.

(57) ABSTRACT

Capacitor designs for substrates, such as interposers, and methods of manufacture thereof are disclosed. In an embodiment, a capacitor is formed between a through via and a lower level metallization layer. The capacitor may be, for example, a planar capacitor formed on the substrate or on a dielectric layer formed over the substrate.

18 Claims, 6 Drawing Sheets

CAPACITOR FOR INTERPOSERS AND METHODS OF MANUFACTURE THEREOF

BACKGROUND

Semiconductor devices are used in a variety of electronic applications, such as personal computers, cell phones, digital cameras, and other electronic equipment, as examples. The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications. One type of smaller packaging that has been developed is three-dimensional (3D) ICs, in which two die or ICs are bonded together and electrical connections are formed between the die and contact pads on an interposer.

In these situations, power and signal lines may be passed through the interposer, from connections on one side of the interposer to dies or other electrical connections on an opposing side of the interposer. The interposer may also include passive components, such as a decoupling capacitor. The current from a power supply flows through the power lines, logic gates, and finally to ground. During the switching of the logic gates, a large amount of change in the current may occur within a short period of time. Decoupling capacitors are used to absorb these glitches during current switching. Decoupling capacitors function as charge reservoirs by maintaining a constant voltage between the supply voltage and ground, preventing momentary drops in the supplied voltage.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to packages for semiconductor devices that utilize an interposer as a component, such as 3DICs. Novel methods of forming interposers having capacitors formed thereon, such as metal-insulator-metal (MIM) capacitors, such as decoupling capacitors, will be described herein.

Figure 1:
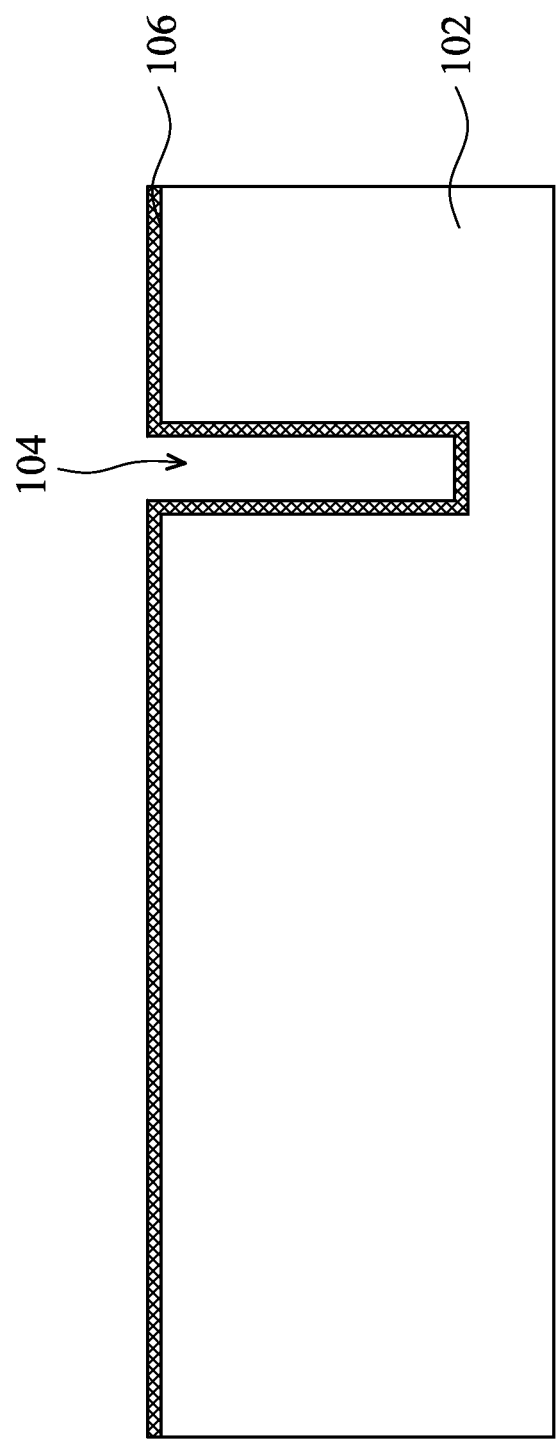
FIGS. 1-6 are cross-sectional views of various intermediate stages of forming a device in accordance with an embodiment.

Referring first to FIG. 1, there is shown a cross-sectional view of a substrate 102 in accordance with an embodiment. The substrate 102 may be any suitable substrate, such as a silicon substrate, a 1/2/1 laminate substrate, a 4-layer laminate substrate, a ceramic substrate, or the like. While the embodiments discussed herein are described in the specific context of an interposer to be used to mount one or more integrated circuits thereto, other embodiments may utilize aspects of the present disclosure in other situations.

One or more openings, such as opening 104, are formed in the substrate 102. As will be discussed in greater detail below, the opening 104 will be subsequently filled with a conductive material to form through vias (TVs). As illustrated in FIG. 1, in an embodiment the opening 104 extends partially into the substrate 102. Subsequent processing may be performed to thin the backside of the substrate 102 to expose and form electrical connections to the TVs.

The opening 104 may be formed by, for example, etching, milling, laser techniques, a combination thereof, and/or the like recesses from a top surface of the substrate 102. For example, in an embodiment, photolithography techniques may be used. Generally, photolithography involves depositing a photoresist material, which is then masked, exposed, and developed, thereby leaving the section of the substrate 102 that is to become the opening 104 exposed. After the photoresist material is patterned, an etching process may be performed to form the opening 104 in the substrate 102 as illustrated in FIG. 1. In an embodiment in which the substrate 102 comprises a silicon interposer, the etching process may be a wet or dry, anisotropic or isotropic, etch process. After the opening 104 is formed, the photoresist material may be removed using, for example, an ashing process.

After the opening 104 is formed, a liner 106 may be deposited over the surface of the substrate 102, such as by chemical vapor deposition (CVD), atomic layer deposition (ALD), physical vapor deposition (PVD), thermal oxidation, a combination thereof, and/or the like. The liner may comprise an oxide, such as $SiO_2$, a nitride, such as $Si_3N_4$, SiC, SiON, or TiN, or other dielectric materials.

Figure 2:
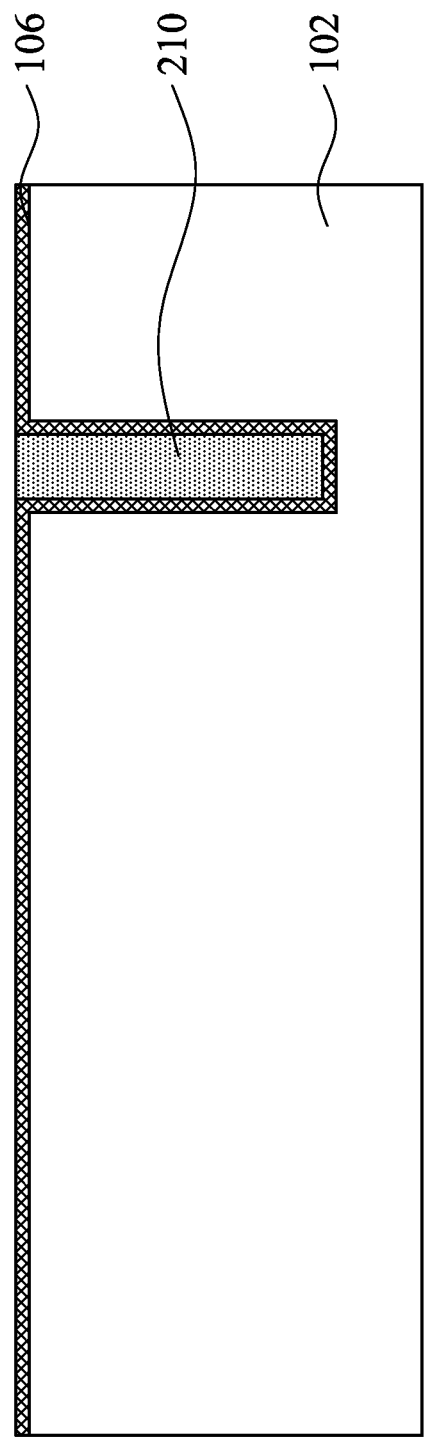

Referring now to FIG. 2, the opening 104 (see FIG. 1) is filled with a conductive material, thereby forming TV 210 in accordance with an embodiment. The TV 210 may be formed, for example, by depositing a layer of the conductive material over the liner 106 and within the opening 104. The conductive material may be formed by an electro-chemical plating process, CVD, ALD, PVD, a combination thereof, and/or the like. Examples of conductive materials include copper, tungsten, aluminum, silver, gold, a combination thereof, and/or the like. Excess conductive material may be removed by, for example, a planarization process, such as a chemical mechanical polishing (CMP) process, using the liner 106 as a stop layer, thereby forming the TV 210 as illustrated in FIG. 2.

Figure 3:
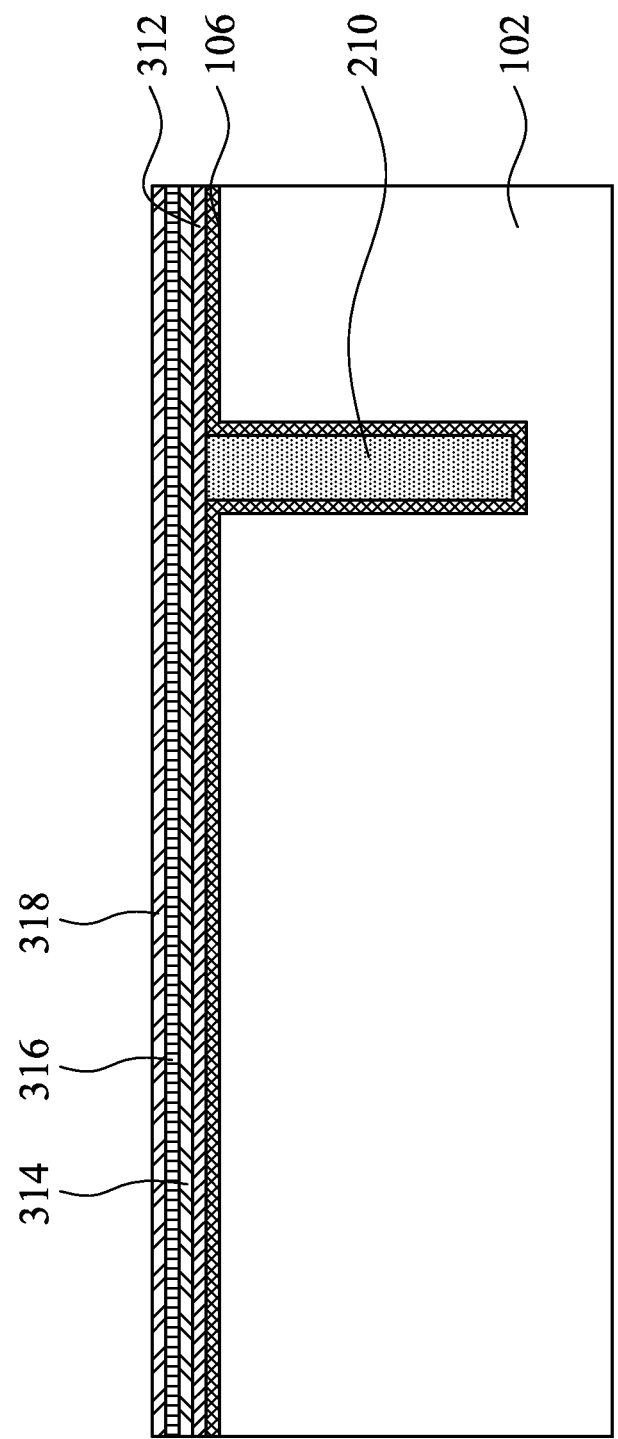

FIG. 3 illustrates forming a first etch stop layer 312 and material layers that are to be subsequently patterned to become a MIM capacitor, e.g., a bottom electrode material layer 314, a capacitor dielectric material layer 316, and a top electrode material layer 318, in accordance with an embodiment. The first etch stop layer 312 provides an etch stop during later processing, such as forming electrical connections to the TV 210, as well as providing an additional isolation layer between the subsequently formed capacitor and the substrate 102. In an embodiment, the first etch stop layer 312 may be formed of a dielectric material such as a silicon-containing material, a nitrogen-containing material, an oxygen-containing material, a carbon-containing material or the like.

Next, a bottom electrode material layer 314 is formed over the first etch stop layer 312. The bottom electrode material layer 314 may comprise a layer of conductive material such as TaN, TiN, or the like.

The capacitor dielectric material layer 316 is formed over the bottom electrode material layer 314 as shown in FIG. 3. In an embodiment, the capacitor dielectric material layer 316 may comprise a high dielectric constant (k) material having a dielectric constant greater than the dielectric constant of $SiO_2$, for example, such as ZrO, HfO, $Si_3N_4$, or BST, although other materials may be used. The top electrode material layer 318 comprising similar materials and dimensions as described for the bottom electrode material layer 314 is formed over the capacitor dielectric material layer 316.

Figure 4:
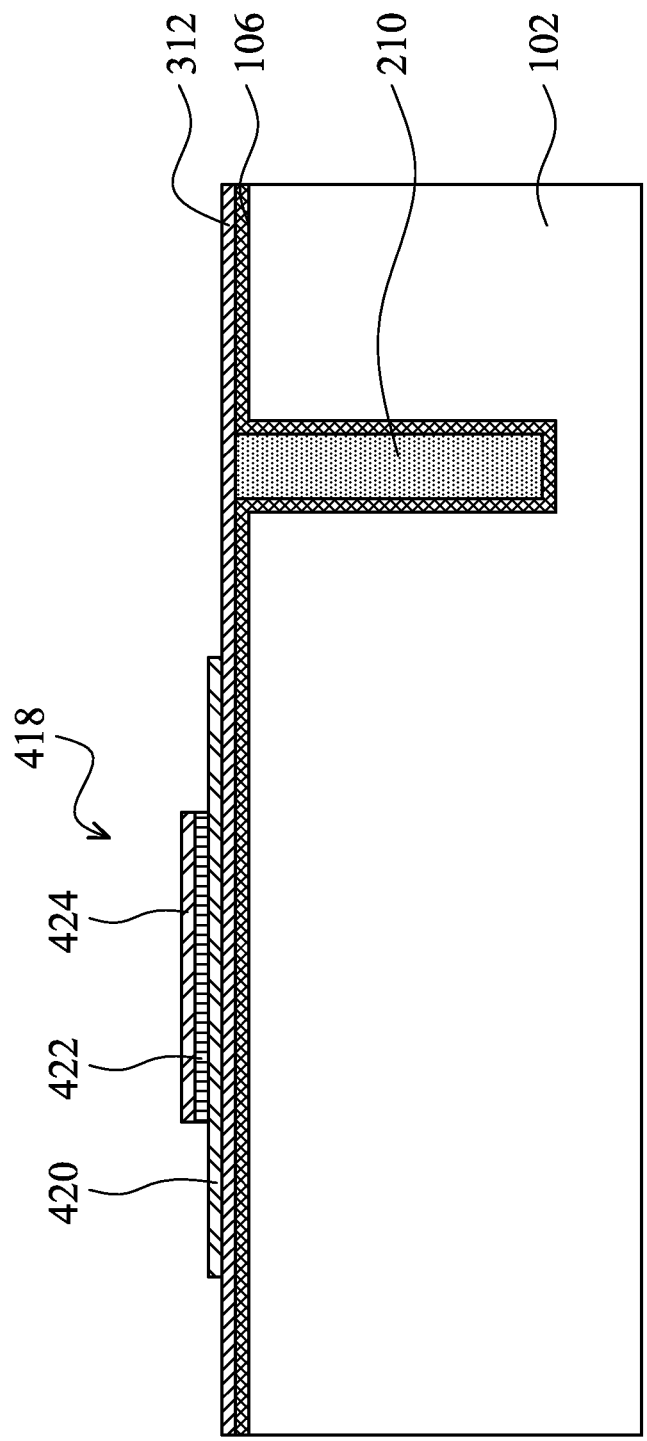

FIG. 4 illustrates patterning of the bottom electrode material layer 314, the capacitor dielectric material layer 316, and the top electrode material layer 318 to form a bottom electrode 420, a capacitor dielectric layer 422, and a top electrode 424, respectively, of a capacitor 418 in accordance with an embodiment. In an embodiment, the capacitor 418 comprises a MIM capacitor, although other types of materials may be used. The bottom electrode material layer 314, the capacitor dielectric material layer 316, and the top electrode material layer 318 may be patterned using one or more photolithography and etching processes. For example, a first photolithography process may be used to pattern a first mask for the bottom electrode 420. One or more etching processes may then be utilized to pattern the bottom electrode material layer 314, the capacitor dielectric material layer 316, and the top electrode material layer 318. Thereafter, a second photolithography process may be used to pattern a second mask corresponding to a shape of the top electrode 424. The second mask is then used for one or more etching processes to pattern the top electrode material layer 318 and the capacitor dielectric material layer 316.

In the embodiment illustrated in FIG. 4, the bottom electrode 420 extends beyond the lateral boundaries of the top electrode 424. In this manner, electrical contact may be made to the bottom electrode from above as discussed in greater detail below.

Figure 5:
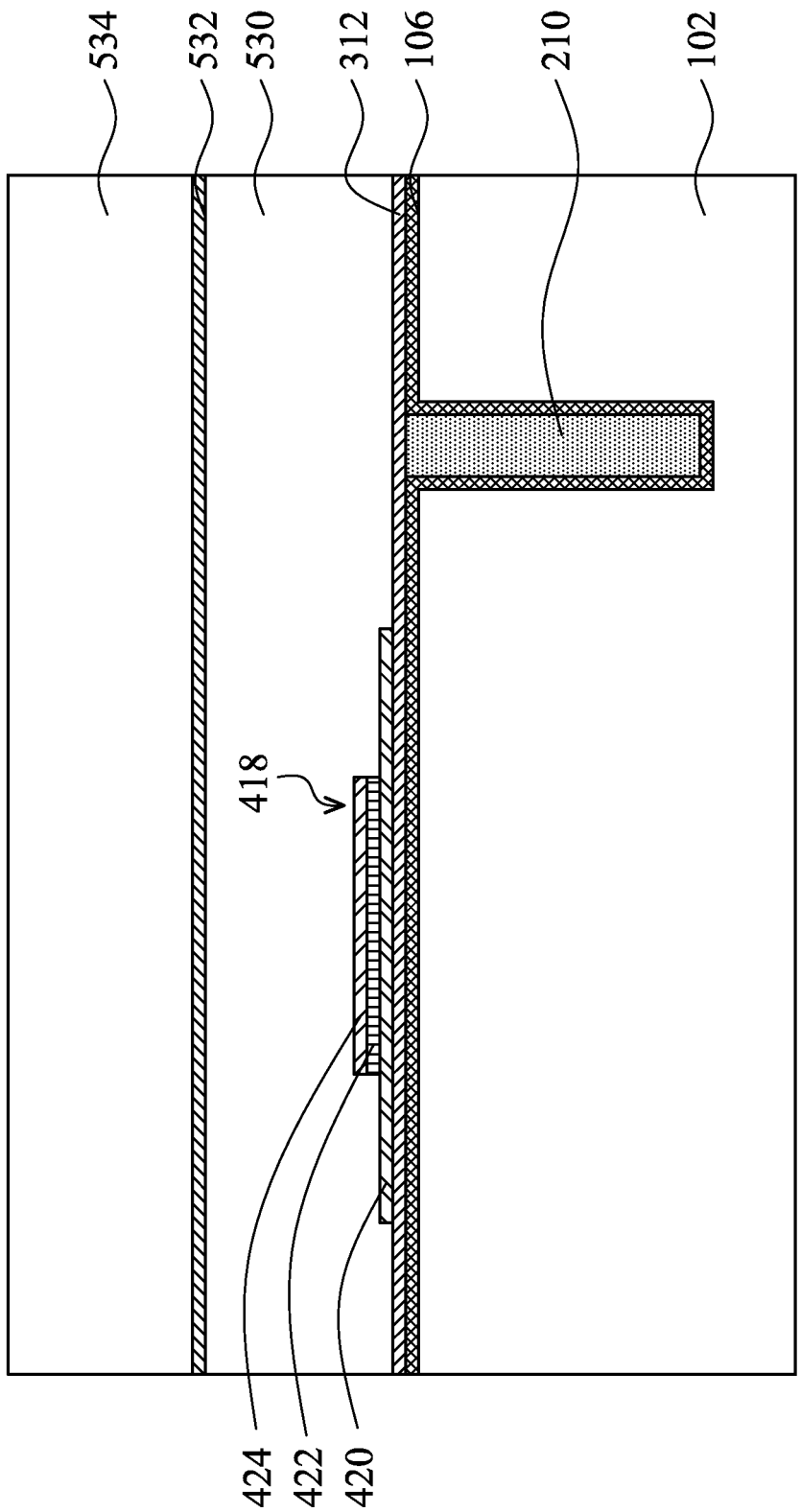

Referring now to FIG. 5, there is shown a first insulating layer 530, a second etch stop layer 532, and a second insulating layer 534 formed over the capacitor 418 in accordance with an embodiment. The first insulating layer 530, the second etch stop layer 532 and the second insulating layer 534 act as a dielectric layer in which metallization layers may be subsequently formed. The first insulating layer 530 and the second insulating layer 534 may comprise a dielectric or low-k dielectric layer. For example, in an embodiment the first insulating layer 530 and the second insulating layer 534 may comprise $SiO_2$, BPSG, TEOS, HDP oxide, SOG, USG, FSG, Black Diamond™, or other insulating materials. The first insulating layer 530 and the second insulating layer 534 may be formed of a same type of material or a different type of material.

The second etch stop layer 532 may be formed of a dielectric material having a high etch selectivity with the material or materials used to form the first insulating layer 530 and the second insulating layer 534. For example, the second etch stop layer 532 may comprise a nitride such as $Si_3N_4$, SiC, SiON, TiN, or other dielectric materials.

Figure 6:
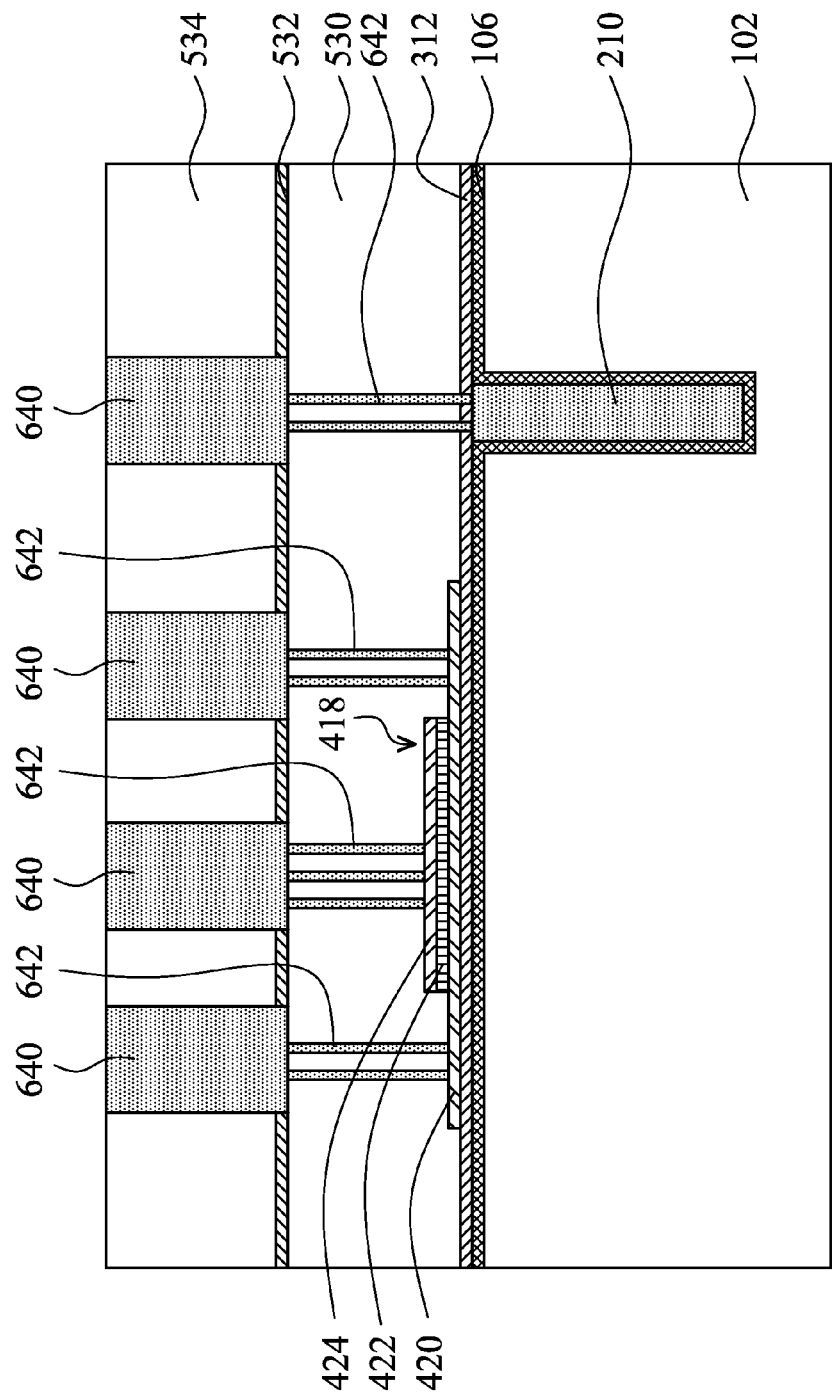

FIG. 6 illustrates formation of the first metallization (M1) layer 640 and vias 642 (e.g., vias V0) interconnecting the first metallization layer 640 with components formed on the substrate 102 in accordance with an embodiment. As illustrated in FIG. 6, the first metallization layer 640 and vias 642 provide an electrical connection to the vias and electrodes of the capacitor 418. Openings corresponding to the first metallization layer 640 and the vias 642 may be formed in the first insulating layer 530 and the second insulating layer 534 using, for example, a dual damascene process. Conductive material is deposited over the first insulating layer 530 and the second insulating layer 534 to fill the openings. Excess conductive material may be removed using one or more etch processes or CMP processes, leaving the structure shown in FIG. 6. In an embodiment, the conductive material used to form the first metallization layer 640 and vias 642 may comprise, for example, aluminum, copper, tungsten, combinations thereof, or the like. A barrier and/or liner (not shown) may also be used.

Thereafter, other processing steps may be performed, such as, forming additional metallization layers, forming external contacts, thinning a backside of the substrate, attaching one or more dies to the substrate, attaching the substrate to another substrate (e.g., printed circuit board, another interposer, packaging substrate, etc.), and the like.

As can be appreciated, embodiments such as those disclosed herein, provides a capacitor integrated on a substrate, such as an interposer, that may avoid issues related to hillocks that may be caused by an underlying metal feature. For example, by placing the capacitor on the substrate, a more planar surface may be obtained upon which the capacitor may be formed. The metallization layers may be characterized by hillocks, and forming the capacitor on these hillocks may result in degradation of the voltage breakdown ($V_{bd}$) and may result in insufficient routing area below the capacitor in high density designs. Embodiments such as those disclosed herein provide a planar surface, e.g., the substrate or a uniform layer formed on the substrate, may remove or reduce these issues. Embodiments such as those disclosed herein provide for a capacitor formed on the substrate and/or between a through via and the metallization layer.

In an embodiment, a method of forming a device is provided. The method includes providing a substrate and forming a capacitor over a surface of the substrate. A lowermost metallization layer is formed over the capacitor.

In another embodiment, a method of forming a device is provided. The method includes providing a substrate and forming a through via extending from a surface of the substrate into the substrate. A capacitor is formed having a top electrode and a bottom electrode over a surface of the substrate. A first dielectric layer is formed over the substrate and the capacitor. A plurality of conductive features is formed in the first dielectric layer, corresponding ones of the plurality of conductive features extending through the dielectric layer to the bottom electrode, the top electrode, and the through via.

In yet another embodiment, a device is provided. The device includes a substrate and a lowermost metallization layer overlying the substrate. A capacitor is positioned between the substrate and the lowermost metallization layer.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a device, the method comprising:
providing a substrate;
forming a through via from a surface of the substrate extending into the substrate;
forming a dielectric layer over the through via;
after the forming the dielectric layer, forming a capacitor over a surface of the substrate; and
forming one or more metallization layers over the capacitor, the capacitor being below a lowermost connection layer.

2. The method of claim 1, wherein capacitor is a metal-insulator-metal (MIM) capacitor.

3. The method of claim 1, wherein the substrate comprises a silicon interposer.

4. The method of claim 1, wherein the capacitor is a planar capacitor.

5. A method of forming a device, the method comprising:
providing a substrate;
forming a through via extending from a surface of the substrate into the substrate;
forming a capacitor over a surface of the substrate, the capacitor having a top electrode and a bottom electrode;
forming a first dielectric layer over the substrate and the capacitor; and
forming a plurality of conductive features in the first dielectric layer, corresponding ones of the plurality of conductive features extending through the dielectric layer to the bottom electrode, the top electrode, and the through via, the plurality of conductive features being part of a lowermost metallization layer.

6. The method of claim 5, wherein the substrate is an interposer.

7. The method of claim 5, wherein the forming the through via is performed prior to the forming the bottom electrode of the capacitor.

8. The method of claim 5, wherein the capacitor is a planar capacitor.

9. The method of claim 5, further comprising forming a second dielectric layer over the through via and the forming a capacitor comprises forming the capacitor on the second dielectric layer.

10. A device comprising:
a substrate;
a lowermost metallization layer overlying the substrate, wherein the lowermost metallization layer is the M1 metallization layer; and
a capacitor positioned between the substrate and the lowermost metallization layer.

11. The device of claim 10, wherein the substrate is an interposer.

12. The device of claim 10, further comprising a through via extending from a first surface of the substrate into the substrate.

13. The device of claim 12, wherein an upper surface of the through via is lower than a lower surface of the capacitor.

14. The device of claim 10, wherein the capacitor comprises a metal-insulator-metal (MIM) capacitor.

15. The device of claim 10, further comprising one or more dielectric layers interposed between a bottom electrode of the capacitor and the substrate.

16. The device of claim 10, wherein the capacitor is a planar capacitor.

17. The device of claim 10, wherein a bottom electrode of the capacitor extends laterally beyond a top electrode of the capacitor.

18. The device of claim 10, further comprising a first metallization layer and a first via layer, the first via layer extending from a top electrode and a bottom electrode of the capacitor to respective features in the first metallization layer.

* * * * *